(12) United States Patent
Moriwaki et al.

(10) Patent No.: US 11,557,554 B2
(45) Date of Patent: Jan. 17, 2023

(54) SEMICONDUCTOR DEVICE

(71) Applicant: Mitsubishi Electric Corporation, Tokyo (JP)

(72) Inventors: Takao Moriwaki, Tokyo (JP); Katsumi Miyawaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 106 days.

(21) Appl. No.: 17/050,567

(22) PCT Filed: Jul. 12, 2018

(86) PCT No.: PCT/JP2018/026324
§ 371 (c)(1),
(2) Date: Oct. 26, 2020

(87) PCT Pub. No.: WO2020/012598
PCT Pub. Date: Jan. 16, 2020

(65) Prior Publication Data
US 2021/0242144 A1    Aug. 5, 2021

(51) Int. Cl.
*H01L 23/66* (2006.01)
*H01L 23/12* (2006.01)
(Continued)

(52) U.S. Cl.
CPC .............. *H01L 23/66* (2013.01); *H01L 23/12* (2013.01); *H01L 23/3121* (2013.01);
(Continued)

(58) Field of Classification Search
CPC ..... H01L 23/66; H01L 23/12; H01L 23/3121; H01L 23/53228; H01L 2223/664; H05K 1/56
See application file for complete search history.

(56) References Cited

U.S. PATENT DOCUMENTS 6,683,512 B2   1/2004   Nakamata et al.
6,720,651 B2   4/2004   Gaku et al.
(Continued)

FOREIGN PATENT DOCUMENTS

JP   2001-250881 A   9/2001
JP   2003-046022 A   2/2003
(Continued)

OTHER PUBLICATIONS

An Office Action; "Notice of Reasons for Refusal", mailed by the Japanese Patent Office dated Mar. 8, 2022, which corresponds to Japanese Patent Application No. 2020-529912 and is related to U.S. Appl. No. 17/050,567; with English language translation.
(Continued)

*Primary Examiner* — Peniel M Gumedzoe
(74) *Attorney, Agent, or Firm* — Studebaker & Brackett PC

(57) ABSTRACT

A semiconductor device includes: a thick copper member in which a semiconductor chip is mounted; a printed circuit board that is disposed on a front surface of the thick copper member and provided with an opening exposing a part of the front surface of the thick copper member, a wiring pattern, and conductive vias connecting the pattern and the thick copper member; a semiconductor chip mounted on the front surface of the thick copper member exposed through the opening and connected to the pattern by a metal wire; an electronic component mounted on a front surface of the printed circuit board opposite to a side facing the thick copper member and connected to the pattern; and a cap or an epoxy resin sealing the front surface of the printed circuit board opposite to a side facing the thick copper member, the chip, the component, and the metal wire.

19 Claims, 6 Drawing Sheets

(51) Int. Cl.
  *H01L 23/31* (2006.01)
  *H01L 23/532* (2006.01)
  *H05K 1/05* (2006.01)
  *H05K 3/46* (2006.01)

(52) U.S. Cl.
  CPC ....... *H01L 23/53228* (2013.01); *H05K 1/056* (2013.01); *H05K 3/46* (2013.01); *H01L 2223/6644* (2013.01)

(56) References Cited

U.S. PATENT DOCUMENTS

| | | |
|---|---|---|
| 2003/0002260 A1 | 1/2003 | Hasebe et al. |
| 2004/0207073 A1 | 10/2004 | Hasebe et al. |
| 2007/0023202 A1 | 2/2007 | Shibata et al. |
| 2007/0080447 A1 | 4/2007 | Hasebe et al. |
| 2007/0242440 A1 | 10/2007 | Sugaya et al. |
| 2008/0099911 A1* | 5/2008 | Machida ............ H01L 23/5389 257/E23.024 |
| 2009/0008128 A1 | 1/2009 | Hasebe et al. |
| 2010/0139088 A1 | 6/2010 | Shibata et al. |

FOREIGN PATENT DOCUMENTS

| | | |
|---|---|---|
| JP | 2004-031812 A | 1/2004 |
| JP | 2006-147822 A | 6/2006 |
| JP | 2006-216755 A | 8/2006 |
| JP | 2007-066942 A | 3/2007 |
| JP | 2007-096083 A | 4/2007 |
| JP | 2008-153400 A | 7/2008 |
| JP | 2010-186880 A | 8/2010 |
| JP | 2010-219554 A | 9/2010 |
| JP | 2011-166029 A | 8/2011 |
| JP | 2015-035495 A | 2/2015 |

OTHER PUBLICATIONS

An Office Action mailed by Taiwanese Patent dated Oct. 29, 2020, which corresponds to Patent Application No. 108116892 and is related to U.S. Appl. No. 17/050,567 with English language translation.

An Office Action; "Notice of Reasons for Refusal", mailed by the Japanese Patent Office dated Aug. 31, 2021, which corresponds to Japanese Patent Application No. 2020-529912 and is related to U.S. Appl. No. 17/050,567; with English language translation.

International Search Report issued in PCT/JP2018/026324; dated Oct. 2, 2018.

* cited by examiner

SEMICONDUCTOR DEVICE

TECHNICAL FIELD

The present application relates to a semiconductor device.

BACKGROUND ART

As a wireless communication system represented by mobile phone base stations, a fifth generation mobile communication system (5G) is expected to be launched as a next-generation communication system in the near future. This communication system enables more simultaneous and larger capacity connections than in the past, and it is considered that antennas will be installed in many areas, especially in high-density population areas. In order to satisfy these requirements, a semiconductor device with a small size and low power consumption is necessary. In addition to the above, a low cost semiconductor device without an extreme increase in its cost compared with that in the fourth generation mobile communication system is required.

Currently, in a semiconductor device used for a wireless communication such as the mobile communication system, and in consideration of ease of use for customers, a module structure is adopted in which a high frequency circuit is formed on a printed circuit board, a chip of semiconductor element (semiconductor chip) and electronic components such as chip capacitors are mounted on the circuit at the same time, and a high frequency signal is matched on the printed circuit board.

In general, the printed circuit board used for a semiconductor device having the module structure uses an organic substrate as a base material made from a glass epoxy resin or the like. However, the base material described above has very poor thermal conductivity, and thereby the thermal resistance is high. Thus, an amplifier using a semiconductor element (active element) such as a gallium nitride (GaN) element that is operated in the active manner and at a high power density, characteristics thereof are degraded owing to the temperature rise of the semiconductor element. For the reason above, it is essential to reduce the thermal resistance of the semiconductor element itself, and a problem arises in that the gate interval in the semiconductor element constituting the amplifier must be made larger than necessary, and the size of the chip on which the semiconductor element is formed increases. As the chip size of the semiconductor element increases, the mounting area thereof increases, and an increase in the package size of the semiconductor device will be a problem. Since the cost of the chip increases when the size of the semiconductor element increases, it is preferable that the size of the semiconductor element be as small as possible.

A configuration of a semiconductor device is available in which a lead frame such as that of a quad flat non-lead package (QFN) is adopted and a monolithic microwave integrated circuit (MMIC) incorporating a high frequency circuit is directly mounted on a copper frame in order to reduce the thermal resistance of the semiconductor device or in which a high frequency circuit as a passive element is formed on a semiconductor such as gallium arsenide (GaAs) as a separate chip (semiconductor chip) to reduce the cost and an active element (semiconductor chip) is directly mounted on a copper frame, thereby reducing the thermal resistance of the semiconductor device. However, when a number of the semiconductor chips are used, the mounting area increases, and an increase in the package size of the semiconductor device will be a problem.

In a package structure in which the lead frame such as that in QFN is used, semiconductor chips for the active element and the passive element are directly mounted on a copper frame. However, when a high frequency circuit to be adopted becomes complicated, for example, in the case of adopting a Doherty circuit used in a high output amplifier for a base station, the chip size will be large when the entire Doherty circuit is formed on a single chip, namely, made into an MMIC, and at a frequency of 6 GHz or less, it is generally difficult to make the entire circuit into an IC and put it into one package. Further, even at a frequency of 6 GHz or more, the cost of the chip increases and the cost of the semiconductor device increases.

In order to put a complex high frequency circuit into one package, a printed circuit board having multilayer wirings is generally used. Patent Document 1 discloses a semiconductor device including a first glass-epoxy substrate on which a semiconductor element is surface-mounted, a second glass-epoxy substrate on which solder bumps are formed, and a plurality of solid electrolyte capacitors embedded in a composite layer between the first glass-epoxy substrate and the second glass-epoxy substrate.

CITATION LIST

Patent Document

Patent Document 1: Japanese Patent Application Laid-open No. 2006-216755 (FIG. 1)

SUMMARY OF INVENTION

Problems to be Solved by Invention

In the package structure of the semiconductor device disclosed in Patent Document 1, since a circuit can be formed using multilayer wiring formed on the first and second glass-epoxy substrates (printed circuit boards) and using electronic components such as solid electrolyte capacitors, it is possible to mount a complicated high frequency circuit on the semiconductor device. However, a typical printed circuit board, that is, a double-sided board (double-sided printed circuit board) on which a high frequency circuit is formed on the upper and lower surfaces (front and rear surfaces), or a printed circuit board (multilayer printed circuit board) laminated using a built-up method has a low thermal conductivity and cannot sufficiently dissipate heat generated from a semiconductor element, that is, the heat dissipation characteristics are inferior. For the reason described above, the thermal resistance of the semiconductor device increases, and as a result, in order to reduce the thermal resistance of the active element itself, it is necessary to widen the gate interval of the active element, and thus a problem arises that the chip size of the active element increases.

In the package structure of the semiconductor device disclosed in Patent Document 1, although a complicated high frequency circuit can be mounted, there is a problem that the chip size of the semiconductor element is increased because of insufficient heat dissipation of the printed circuit board, and the package size of the semiconductor device is increased. Therefore, in the package structure of the semiconductor device disclosed in Patent Document 1, without increasing the package size, it is not possible that a complicated high frequency circuit is mounted while high heat dissipation characteristics are maintained.

An object of the technology disclosed in the specification of the present application is to provide a semiconductor device in which a complicated high frequency circuit can be mounted while high heat dissipation characteristics are maintained, that is, to provide a semiconductor device in which high heat dissipation characteristics can be maintained even when a complicated high frequency circuit is mounted.

Means for Solving Problems

An example of a semiconductor device disclosed in the specification of the present application is the semiconductor device in which a plurality of external electrode terminals to be connected to a mounting target apparatus to which the semiconductor device is installed are formed on the rear surface, and the semiconductor chips for processing a high frequency signal are mounted. The example of the semiconductor device includes a thick copper member in which a plurality of external electrode terminals are formed and a semiconductor chip is mounted on one of the plurality of external electrode terminals, a printed circuit board that is disposed on the front surface of the thick copper member and that includes an opening exposing a part of the front surface of the thick copper member, a wiring pattern, and conductive vias connecting the wiring pattern and the thick copper member. The example of the semiconductor device further includes the semiconductor chip mounted on the front surface of the thick copper member exposed through the opening and connected to the wiring pattern by metal wires, electronic components mounted on the front surface of the printed circuit board opposite to the side facing the thick copper member and connected to the wiring pattern, and a cap or an epoxy resin encapsulating or sealing the front surface of the printed circuit board opposite to the side facing the thick copper member, the semiconductor chip, the electronic components, and the metal wires.

Effect of Invention

In the example of the semiconductor device disclosed in the specification of the present application, since the semiconductor chip is mounted on the front surface of the thick copper member exposed through the opening formed in the printed circuit board and the rear surface of the thick copper member is exposed, high heat dissipation characteristics can be maintained even when a complicated high frequency circuit is mounted.

MODES FOR CARRYING OUT INVENTION

Embodiment 1

Figure 1:
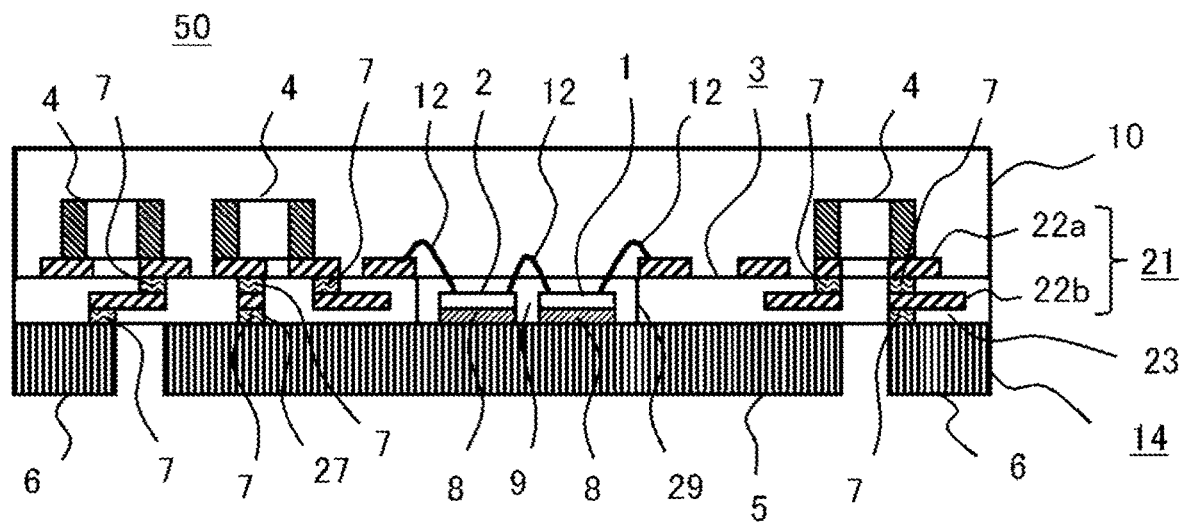
FIG. 1 is a schematic cross sectional view of a semiconductor device according to Embodiment 1.
Figure 2:
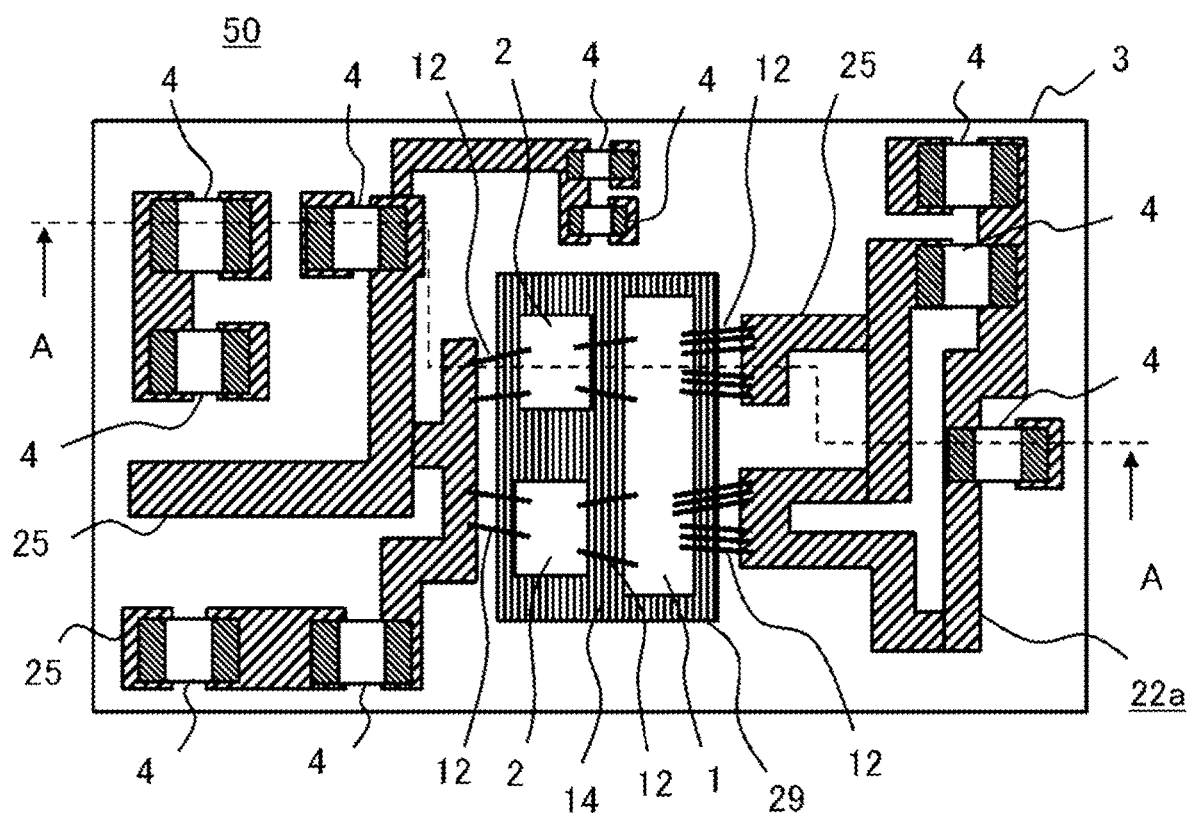
FIG. 2 is a diagram showing a component arrangement on a front side of the semiconductor device of FIG. 1.
Figure 3:
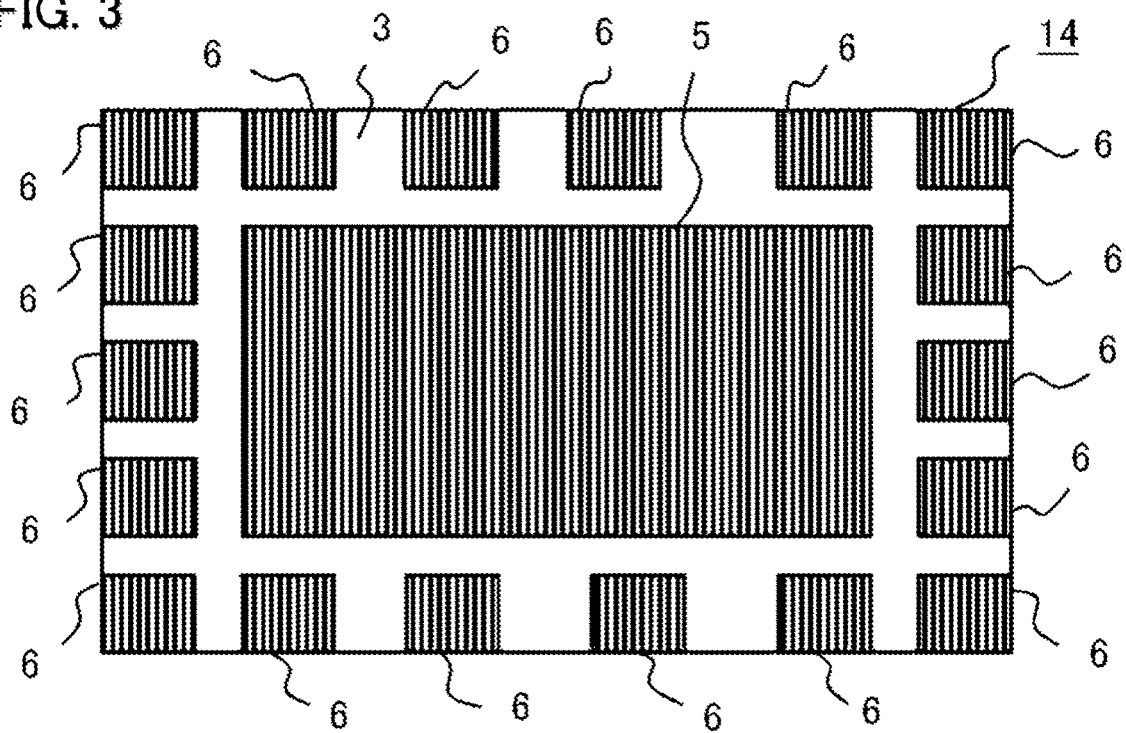
FIG. 3 is a diagram showing the rear surface of the semiconductor device of FIG. 1.

FIG. 1 is a schematic cross sectional view of a semiconductor device according to Embodiment 1. FIG. 2 is a diagram showing a component arrangement on a front side of the semiconductor device of FIG. 1, and FIG. 3 is a diagram showing the rear surface of the semiconductor device of FIG. 1. The schematic cross sectional view of FIG. 1 is that taken along the line A-A in FIG. 2. The semiconductor device 50 of Embodiment 1 includes a printed circuit board 3, semiconductor chips 1 and 2, an electronic components 4, a thick copper member 14 formed on the rear surface of the printed circuit board 3, and a cap 10 that encapsulates the semiconductor chips 1 and 2, the electronic components 4, and the front surface (the side opposite to the rear surface) of the printed circuit board 3. The printed circuit board 3 is a general-purpose printed circuit board that is typically used. The printed circuit board 3 includes a resin base material 23 using a material based on a resin such as a flame retardant type 4 (FR-4) or a flame retardant type 5 (FR-5), and a high frequency circuit formed by a wiring pattern 21 on the front surface or in the inner layer of the resin base material 23, and an opening 29 that is a penetrated hole provided in a part of the printed circuit board 3. The thick copper member 14 is made of a thick copper having a thickness of 100 μm or more, and external electrode terminals 5 and 6 are formed with the thick copper member 14. The external electrode terminal 5 is an external electrode terminal on which the semiconductor chips 1 and 2 are mounted, and the external electrode terminals 6 are external electrode terminals which are disposed on an outer peripheral side of the external electrode terminal 5. The opening 29 of the printed circuit board 3 is formed so as to expose a part of the surface of the external electrode terminal 5. The semiconductor chip 1 is a semiconductor chip in which a semiconductor element (an active element) is formed for processing a high frequency signal with a frequency of 1 GHz or higher and outputting power of 1 W or more, namely, for performing an operation in an active manner at a high power density. The active element formed in the semiconductor chip 1 is, for example, a GaN element of a high power density. The semiconductor chip 2 is a semiconductor chip mounted on the semiconductor device 50 in which a passive element such as a transmission line forming a part of the high frequency circuit. The semiconductor chip 2 is, for example, a chip of a semiconductor such as a GaAs.

In FIG. 1, the printed circuit board 3 having two layers of the wiring pattern 21 (a first wiring patterns 22a and a second wiring patterns 22b) is shown. The wiring pattern on a front side of the printed circuit board 3 is the first wiring pattern 22a, and the wiring pattern of the inner layer formed inside the printed circuit board 3 is the second wiring pattern 22b. The first wiring pattern 22a is patterned by a plurality of wirings 25 as shown in FIG. 2. The second wiring pattern 22b is also patterned by a plurality of wirings 25 as in the first wiring pattern 22a. The electronic components 4 are passive elements such as chip capacitors, and are components of the high frequency circuit in the semiconductor device 50. The electronic components 4 are placed at set positions of the wiring 25 in the first wiring pattern 22a by using a mounter, that is, on solder that is disposed, and fixed to the printed circuit board 3 by melting the solder in a reflow process or the like.

The semiconductor chips 1 and 2 are directly mounted with a die bonding material 8 on the surface of the external electrode terminal 5 (the surface facing the printed circuit board 3) exposed through the opening 29 of the printed circuit board 3. The die bonding material 8 is a silver paste, sintered silver or the like having a low curing temperature (260 degrees Celsius or less) and a low thermal resistance. The inside of the opening 29 that is a penetrated hole formed in the printed circuit board 3 serves as a cavity 9. The semiconductor chips 1 and 2 mounted on the surface of the external electrode terminal 5 are connected to the first wiring pattern 22a on the front surface of the printed circuit board 3 by metal wires 12. The first wiring pattern 22a on the front surface of the printed circuit board 3 is connected to the second wiring pattern 22b inside the printed circuit board 3 through vias 7, namely, conductive vias 7, in which via holes 27 are filled with copper. The second wiring pattern 22b is connected to the external electrode terminals 5 and 6 formed on the rear surface of the printed circuit board 3 through the vias 7 in which the via holes 27 are filled with copper. The wiring pattern 21 formed in the printed circuit board 3 and the external electrode terminals 5 and 6 are electrically connected through the vias 7. In a typical via, a metal plating layer is formed on the inner surface of the via hole 27, and the inner side of the metal plating layer is filled with the resin base material 23 of the printed circuit board 3. In contrast, since the vias 7 of Embodiment 1 have a structure in which the via holes 27 are filled with copper, the heat dissipation of the printed circuit board 3 can be enhanced.

The printed circuit board 3 having a multilayer structure shown in FIG. 1 is manufactured by, for example, using a built-up method, repeating lamination of the resin base material 23 and a metal layer for wiring (copper layer), drilling (via hole formation processing), via filling, and wiring formation processing after formation of the wiring forming the high frequency circuit. Note that, the printed circuit board 3 is not limited to the printed circuit board having the multilayer structure, namely, a multilayer printed circuit board, and may be a single-sided printed circuit board in which a wiring layer is formed only on the front surface or a double-sided printed circuit board in which wiring layers are each formed on the front surface and the rear surface.

A method of assembling the semiconductor device 50 will be described. A printed circuit board with the thick copper in which the thick copper member 14 is formed on the rear surface of the printed circuit board 3 without the opening 29 formed is prepared. On the first wiring pattern 22a on the front side of the printed circuit board 3, solder is formed at required positions by a solder printing method or the like. The electronic components 4 are placed on the solder using a mounter and fixed to the printed circuit board 3 by melting the solder in a reflow process or the like (electronic component mounting process). Note that, if necessary, a cleaning solution may be used to clean and remove the flux component contained in the solder.

In the printed circuit board attached with the thick copper, on which the electronic components 4 are mounted, the opening 29 reaching the thick copper member 14 is formed by laser or drilling in a region where the semiconductor chips 1 and 2 is to be mounted (opening formation process). After the opening 29 is formed in the printed circuit board attached with the thick copper, the semiconductor chips 1 and 2 are directly mounted with the die bonding material 8 on the surface (the surface side facing the printed circuit board 3) of the external electrode terminal 5 exposed through the openings 29 (semiconductor chip mounting process).

Next, using the metal wires 12 such as gold wires, the wiring pattern 21 formed on the printed circuit board 3 is connected to the semiconductor chips 1 and 2 (wire connecting process). Further, in the wire connecting process, the semiconductor chip 1 is connected to the semiconductor chip 2 using the metal wires 12. By the wire connecting process, the semiconductor chip 1 in which the active element is formed, the semiconductor chip 2 in which the passive element is formed, and the high frequency circuit except for the semiconductor chip 2 are connected, and an electronic signal flows between the semiconductor chip 1 formed the active element and the high frequency circuit. The basic structure of the semiconductor device 50 on which the electronic component mounting process, the opening formation process, the semiconductor chip mounting process, and the wire connecting process are performed is as shown in FIG. 1 from which the cap 10 is excluded.

Figure 4:
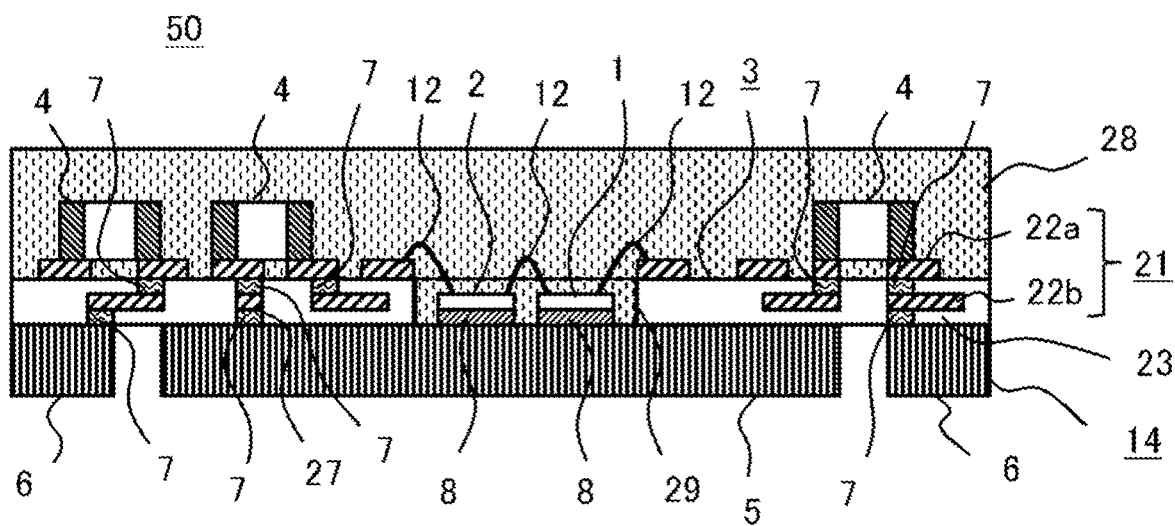
FIG. 4 is a schematic cross sectional view of another semiconductor device according to Embodiment 1.

In the basic structure of the semiconductor device 50 on which the electronic component mounting process, the opening formation process, the semiconductor chip mounting process, and the wire connecting process are performed, the printed circuit board 3, the electronic components 4, and the semiconductor chips 1 and 2 are encapsulated by the cap 10 formed of a metal or a resin (cap encapsulation process). Further, the basic structure of the semiconductor device 50 may be sealed by an epoxy resin 28 as shown in FIG. 4. FIG. 4 is a schematic cross sectional view of another semiconductor device according to Embodiment 1. In the case of the semiconductor device 50 shown in FIG. 4, a resin sealing process is performed. In the resin sealing process, the basic structure of the semiconductor device 50 is inserted into a transfer mold, and the printed circuit board 3, the electronic components 4, and the semiconductor chips 1 and 2 are sealed with the epoxy resin 28 that is melted.

When the printed circuit board 3 on which the cap encapsulation process or the resin sealing process is performed is formed so as to be able to seal a plurality of semiconductor devices 50, the semiconductor devices are divided into individual pieces using a dicer or the like.

Although FIG. 2 shows the semiconductor device 50 in which one semiconductor chip 1 and two semiconductor chips 2 are mounted, this is not a limitation. At least one or more semiconductor chips 1 need to be mounted. Further, in the case where the semiconductor device 50 includes a Doherty circuit, two active elements are required, and thus two active elements are formed in the semiconductor chip 1. Note that, in the case where the semiconductor device 50 includes the Doherty circuit, two active elements may be formed separately formed as the semiconductor chip 1. In the case described above, two semiconductor chips 1 is to be mounted on the semiconductor device 50.

In a single-sided printed circuit board with a high frequency circuit formed on the surface thereof, the double-sided printed circuit board with high frequency circuits formed on the surfaces thereof, or the multilayer printed circuit board obtained by laminating printed circuit boards having high frequency circuits each formed thereon, the printed circuit board 3 used in the semiconductor device 50 of Embodiment 1 is a general-purpose printed circuit board with the penetrated opening 29 formed in a part its area. The semiconductor device 50 of Embodiment 1 has the structure in which the printed circuit board 3 of the general general-purpose printed circuit board and the thick copper member 14 are combined. In the semiconductor device 50 of Embodiment 1, one or more semiconductor chips 1 or one or more semiconductor chips 1 and the semiconductor chip 2 constituting a part of a high frequency circuit are directly mounted on the bottom of the cavity 9 formed in the printed circuit board 3, namely, on the surface of the external electrode terminal 5 exposed through the opening 29. Therefore, in the semiconductor device 50 of Embodiment 1, heat generated from the semiconductor chip 1 in which the active element is formed is dissipated to the thick copper member 14 (the external electrode terminal 5), and thus it is possible to effectively dissipate the heat not through the resin base material 23 of the printed circuit board 3 having poor thermal conductivity. Thus, the semiconductor device 50 of Embodiment 1 can ensure high heat dissipation characteristics and prevent deterioration of high frequency characteristics due to the heat. Furthermore, in the semiconductor device 50 of Embodiment 1, since one or more semiconductor chips 1 or one or more semiconductor chips 1 and the semiconductor chip 2 constituting a part of the high frequency circuit are directly mounted on the surface of the external electrode terminal 5 using the die bonding material 8 having a low thermal resistance, higher heat dissipation can be achieved, and excellent high frequency characteristics can be achieved.

Further, in the semiconductor device 50 of Embodiment 1, by employing the printed circuit board 3, the electronic components 4 such as chip capacitors can be mounted, and a high frequency circuit for matching a high frequency signal is formed on the printed circuit board. That is, high frequency matching can be achieved by the printed circuit board 3. In addition, in the semiconductor device 50 of Embodiment 1, by employing the printed circuit board 3 having the multilayer structure, a part of the high frequency circuit can be configured inside the printed circuit board 3, so that a complicated high frequency circuit can be configured without extremely increasing the area in the front side and a rear side of the semiconductor device.

The semiconductor device 50 of Embodiment 1 can implement basic functions that are both of the function of matching the high frequency signal of 1 GHz or more used in a mobile communication system, etc. and processed by the semiconductor chip 1, and the function of dissipating the heat generated by the power of 1 W or more output by the semiconductor chip 1, by combining the general-purpose printed circuit board 3 and the thick copper member 14. The semiconductor device 50 of Embodiment 1 can implement a complicated circuit configuration represented by the Doherty circuit employed in an amplifier for the base station by combining the printed circuit board 3 having the multi-layer structure with the thick copper member 14. In the semiconductor device 50 of Embodiment 1, since high heat dissipation can be achieved by combining the printed circuit board 3 having the multilayer structure with the thick copper member 14, it is not necessary to widen the gate interval of the active element formed in the semiconductor chip 1, so that the semiconductor chip 1 can be miniaturized. Thus, the semiconductor device can be manufactured at low cost. In the semiconductor device 50 of Embodiment 1, the printed circuit board 3 having the multilayer structure is combined with the thick copper member 14 to have the package structure having a sufficient heat dissipation function even when a complicated circuit configuration is adopted, and thus high-performance high frequency characteristics can be achieved.

As described above, the semiconductor device 50 of Embodiment 1 is the semiconductor device in which a plurality of external electrode terminals 5 and 6 to be connected to a mounting target apparatus to which the semiconductor device is installed are formed on the rear surface, and the semiconductor chip 1 for processing a high frequency signal is mounted. The semiconductor device 50 of Embodiment 1 includes the thick copper member 14 in which a plurality of external electrode terminals 5 and 6 are formed and the semiconductor chip 1 is mounted on one of the plurality of external electrode terminals 5 and 6, the printed circuit board 3 that is disposed on the front surface of the thick copper member 14 and provided with the opening 29 exposing a part of the front surface of the thick copper member 14, the wiring pattern 21, and the conductive vias 7 connecting the wiring pattern 21 and the thick copper member 14. The semiconductor device 50 of Embodiment 1 further includes the semiconductor chip 1 mounted on the front surface of the thick copper member 14 exposed through the opening 29 and connected to the wiring pattern 21 by the metal wires 12, the electronic components 4 mounted on the front surface of the printed circuit board 3 opposite to the side facing the thick copper member 14 and connected to the wiring pattern 21, and the cap 10 or the epoxy resin 28 encapsulating or sealing the front surface of the printed circuit board 3 opposite to the side facing the thick copper member 14, the semiconductor chip 1, the electronic components 4, and the metal wires 12. In the semiconductor device 50 of Embodiment 1, with such a configuration in which the semiconductor chip 1 is mounted on the front surface of the thick copper member 14 exposed through the opening 29 formed in the printed circuit board 3, and the rear surface of the thick copper member 14 is exposed, high heat dissipation characteristics can be maintained even when a complicated high frequency circuit is mounted.

Embodiment 2

Figure 5:
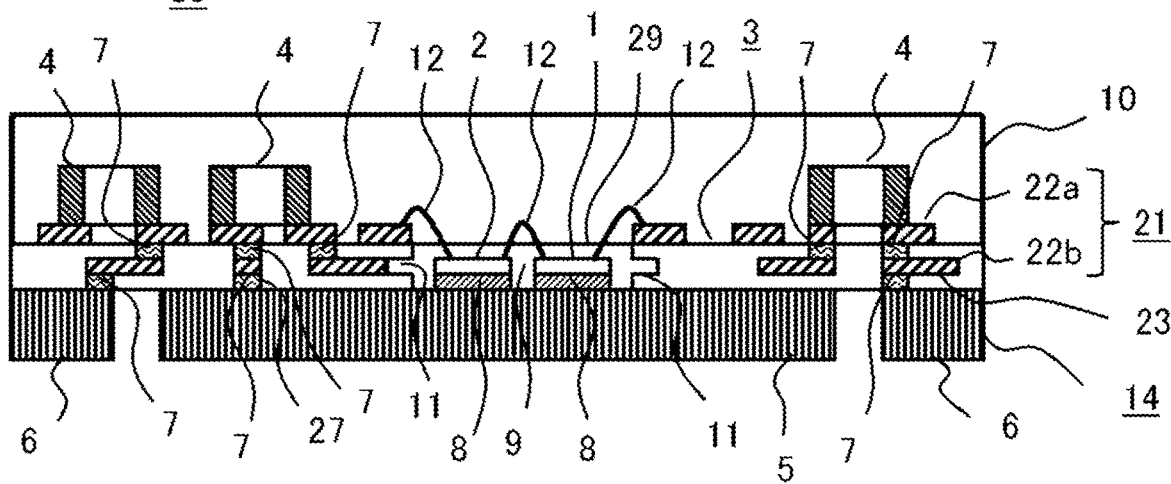
FIG. 5 is a schematic cross sectional view of a semiconductor device according to Embodiment 2.

FIG. 5 is a schematic cross sectional view of a semiconductor device according to Embodiment 2. The same components as the semiconductor device 50 of Embodiment 1 are denoted by the same signs, and repetitive explanations are omitted. Note that, also in other embodiments, the same components as the semiconductor device 50 of Embodiment 1 are denoted by the same signs, and repetitive explanations are omitted. In the semiconductor device 50 of Embodiment 2, a recess 11 is formed on a side surface of the opening 29 of the printed circuit board 3. That is, the semiconductor device 50 of Embodiment 2 differs from that of Embodiment 1 in that the recess 11 is provided on the side surface of the opening 29. Note that the recess 11 may be located at any position on the side surface of the opening 29.

The cavity 9 formed in the printed circuit board 3 shown in Embodiment 1 is preferably as small as possible because it limits the area of the printed circuit board 3 for configuring an another high frequency circuit in the area other than the cavity. Thus, since it is difficult to secure a sufficiently large mounting area in the cavity 9, namely, a surface area of the external electrode terminal 5 exposed through the opening 29, as an area for mounting the semiconductor chips 1 and 2 with the die bonding material 8 such as the silver paste or the sintered silver, high accuracy is required for the coating amount and the coating position of the die bonding material 8. For reason above, when the coating amount of the die bonding material 8 applied and the positional accuracy vary and the die bonding material 8 is applied more than necessary in the cavity 9, the die bonding material 8 may creep up the side surface of the opening 29, and the die bonding material 8 may contaminate the connection region of the first wiring pattern 22a to which the metal wires 12 are connected. However, in the semiconductor device 50 of Embodiment 2, since the recess 11 is formed on the side surface of the opening 29 of the printed circuit board 3, the die bonding material 8 that is excessive can be lead to the recess 11 to prevent the die bonding material 8 from creeping up to the front surface of the printed circuit board 3.

In the semiconductor device 50 of Embodiment 2, since the die bonding material 8 that is excessive can be lead to the recess 11, high coating accuracy of the die bonding material 8 is not required. In the semiconductor device 50 of Embodiment 2, since it is not necessary to increase the coating accuracy of the die bonding material 8, the restriction on the function of the apparatus for applying the die bonding material 8 can be reduced. In addition, in the semiconductor device 50 of Embodiment 2, the die bonding material 8 can be prevented from creeping up the side surface of the opening 29, and the contamination of the connection region of the metal wires 12 in the printed circuit board 3 can be avoided. Thus, yield in the assembly of the semiconductor device 50 can be improved, and high-quality metal wire connection (wire bonding) can be achieved. Furthermore, since the semiconductor device 50 of Embodiment 2 includes the structure of the semiconductor device 50 of Embodiment 1, the same effects as those of the semiconductor device 50 of Embodiment 1 can be obtained.

Embodiment 3

Figure 6:
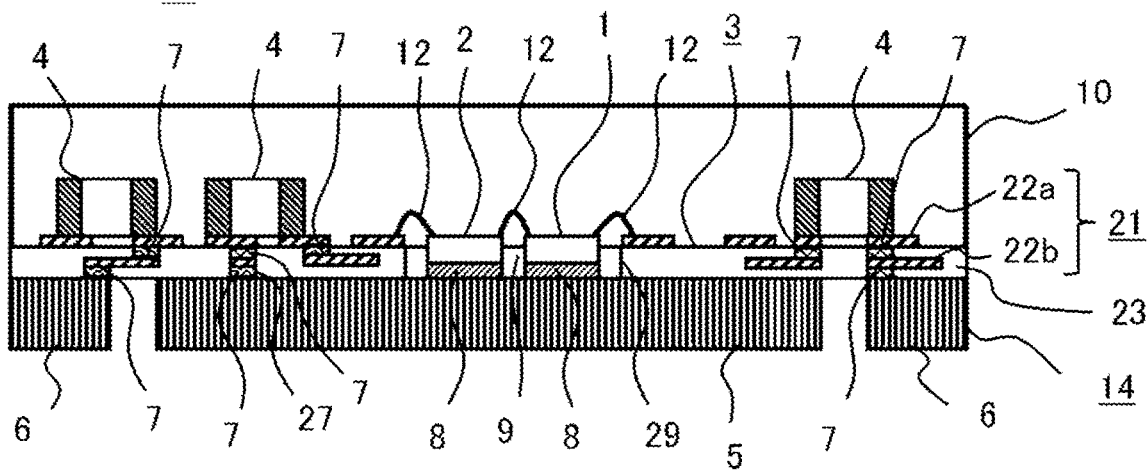
FIG. 6 is a schematic cross sectional view of a semiconductor device according to Embodiment 3.

FIG. 6 is a schematic cross sectional view of a semiconductor device according to Embodiment 3. The semiconductor device 50 of Embodiment 3 is different from the semiconductor device 50 of Embodiment 1 in that the height of the first wiring pattern 22a formed on the front surface of the printed circuit board 3 with respect to the thick copper member 14 as a reference is −10% to +10% of the height of the semiconductor chips 1 and 2 with respect to the thick copper member 14 as the reference. FIG. 6 shows an example in which the height of the first wiring pattern 22a formed on the front surface of the printed circuit board 3 with respect to the thick copper member 14 as the reference is equal to the height of the semiconductor chips 1 and 2 with respect to the thick copper member 14 as the reference, that is, the surface position of the first wiring pattern 22a formed on the front surface of the printed circuit board 3 is equal to the surface positions of the semiconductor chips 1 and 2. As shown in FIG. 6, the surface position of the first wiring pattern 22a and the surface positions of the semiconductor chips 1 and 2 are the same with respect to the thick copper member 14 as the reference. In the semiconductor device 50 of Embodiment 3, with respect to the thick copper member 14 as the reference, since the surface position of the first wiring pattern 22a is equal to the surface positions of the semiconductor chips 1 and 2, the metal wires 12 connecting the first wiring pattern 22a of the printed circuit board 3 to the semiconductor chips 1 and 2 can be formed to be shortest in length.

A method of making the surface position of the first wiring pattern 22a and the surface positions of the semiconductor chips 1 and 2 equal with respect to the thick copper member 14 as the reference will be described. In the first method, the thickness of the printed circuit board 3 is reduced so that the surface position of the first wiring pattern 22a and the surface positions of the semiconductor chips 1 and 2 with respect to the thick copper member 14 as the reference can be made equal. For example, by selecting the dielectric constant or the like of the resin base material 23 of the printed circuit board 3, the thickness of the printed circuit board 3 can be changed. Further, the thickness of the first wiring patterns 22a and 22b may be changed. In the second method, the semiconductor chips 1 and 2 are thickened so that the surface position of the first wiring pattern 22a and the surface positions of the semiconductor chips 1 and 2 can be made equal with respect to the thick copper member 14 as the reference. The third method is a method in which the first method and the second method are used in combination to make the surface position of the first wiring pattern 22a and the surface positions of the semiconductor chips 1 and 2 with respect to the thick copper member 14 as the reference equal. FIG. 6 shows an example in which the surface position of the first wiring pattern 22a and the surface positions of the semiconductor chips 1 and 2 are made equal with respect to the thick copper member 14 as the reference by the third method.

In an example in which the height of the first wiring pattern 22a formed on the front surface of the printed circuit board 3 with respect to the thick copper member 14 as the reference is equal to the height of the semiconductor chips 1 and 2 with respect to the thick copper member 14 as the reference, the metal wires 12 connecting the first wiring pattern 22a of the printed circuit board 3 to the semiconductor chips 1 and 2 can be formed to be shortest in length. If the height of the first wiring pattern 22a formed on the front surface of the printed circuit board 3 with respect to the thick copper member 14 as a reference is −10% to +10% of the height of the semiconductor chips 1 and 2 with respect to the thick copper member 14 as the reference, the first wiring pattern 22a and the semiconductor chips 1 and 2 can be connected with the metal wires 12 that are sufficiently short in length.

The high frequency circuit configured on the printed circuit board 3 includes the metal wires 12 that connect the semiconductor chip 1 in which the active element is formed, the semiconductor chip 2 in which the passive element is formed, and the first wiring pattern 22a. If the length of the metal wires 12 can be reduced, the configuration of the high frequency circuit formed after the step of connecting the metal wires 12 can be made flexible. In other words, the adjustment of the high frequency circuit can be facilitated. If the length of the metal wires 12 is longer than necessary, it is necessary to configure a circuit for canceling an excess length after the step of connecting the metal wires 12. This complicates the adjustment of the high frequency circuit and prolongs the adjustment work, thereby reducing the productivity.

In the semiconductor device 50 of Embodiment 3, by shortening the wire length of the metal wires 12 connecting the semiconductor chips 1 and 2 to the first wiring pattern 22a formed on the front surface of the printed circuit board 3, the flexibility in the configuration of the high frequency circuit, that is, the flexibility in designing the high frequency circuit can be increased. In addition, in the semiconductor device 50 of Embodiment 3, the wire length of the metal wires 12 is shortened, and thus it is possible to reduce the variation of the high frequency characteristics due to the variation in the wire length. Since the semiconductor device 50 of Embodiment 3 includes the structure of the semiconductor device 50 of Embodiment 1, the same effects as those of the semiconductor device 50 of Embodiment 1 can be obtained.

Embodiment 4

Figure 7:
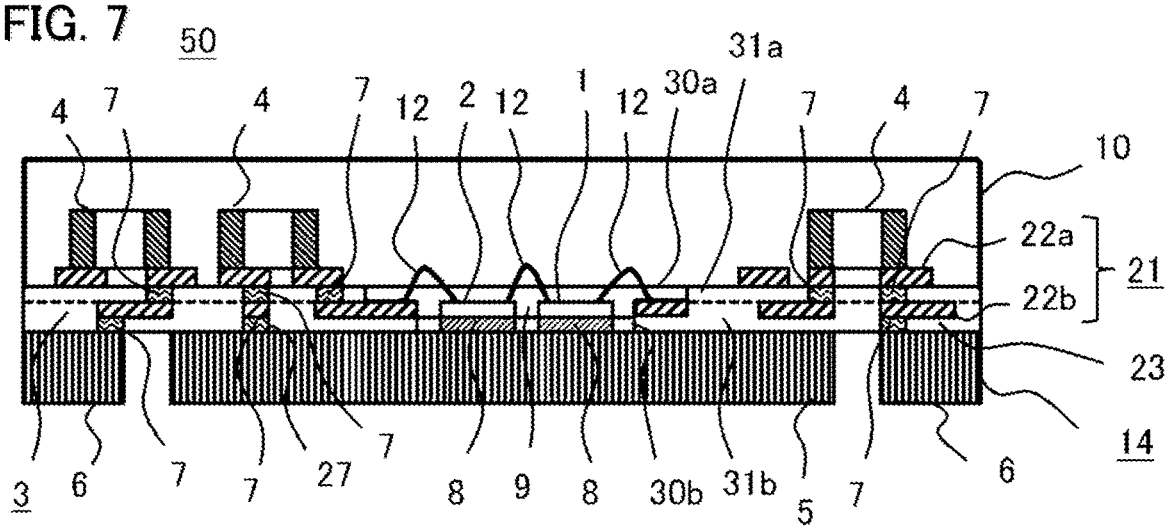
FIG. 7 is a schematic cross sectional view of a semiconductor device according to Embodiment 4.

FIG. 7 is a schematic cross sectional view of a semiconductor device according to Embodiment 4. The semiconductor device 50 of Embodiment 4 is different from the semiconductor device 50 of Embodiment 1 in that the printed circuit board 3 is a multilayer printed circuit board, and the height of an inner second wiring pattern 22b exposed through an opening 29 formed in a staircase shape with respect to the thick copper member 14 as a reference is −10% to +10% of the height of the semiconductor chips 1 and 2 with respect to the thick copper member 14 as the reference. FIG. 7 shows an example in which the height of the inner second wiring pattern 22b exposed through the opening 29 formed in the staircase shape with respect to the thick copper member 14 as the reference is equal to the height of the semiconductor chips 1 and 2 with respect to the thick copper member 14 as the reference, that is, the surface position of the inner second wiring pattern 22b exposed through the opening 29 formed in the staircase shape is equal to the surface positions of the semiconductor chips 1 and 2. As shown in FIG. 7, with respect to the thick copper member 14 as the reference, the surface position of the inner second wiring pattern 22b of the printed circuit board 3 is equal to the surface positions of the semiconductor chips 1 and 2. In the semiconductor device 50 of Embodiment 4, with respect to the thick copper member 14 as the reference, since the surface position of the inner second wiring pattern 22b of the printed circuit board 3 is equal to the surface positions of the semiconductor chips 1 and 2, the metal wires 12 connecting the second wiring pattern 22b of the printed circuit board 3 to the semiconductor chips 1 and 2 can be formed to be shortest in length.

When the high frequency circuit mounted on the semiconductor device 50 is complicated, the number of layers of the printed circuit board 3 having the multilayer structure increases, and the thickness of the printed circuit board 3 increases. With respect to the thick copper member 14 as the reference, when the surface position of the first wiring pattern 22a on the front surface of the printed circuit board 3 is higher than the surface positions of the semiconductor chips 1 and 2, the inner wiring pattern (second wiring pattern 22b) of the printed circuit board 3 having the multilayer structure is appropriately selected and the opening 29 is formed such that the wiring pattern (second wiring pattern 22b) is to be exposed, and the surface position of the inner second wiring pattern 22b of the printed circuit board 3 can be made equal to the surface positions of the semiconductor chips 1 and 2, with respect to the thick copper member 14 as the reference. In addition, when the high frequency circuit mounted on the semiconductor device 50 is not complicated, the number of layers of the printed circuit board 3 having the multilayer structure may be appropriately selected. FIG. 7 shows an example in which the number of layers of the printed circuit board 3 having the multilayer structure is selected to be two, that is, the printed circuit board 3 having a two-layer structure is used, and the surface position of the inner second wiring pattern 22b of the printed circuit board 3 and the surface positions of the semiconductor chips 1 and 2 are the same with respect to the thick copper member 14 as the reference.

Further, the three methods described in Embodiment 3 may be used in combination with the method in which the inner wiring pattern (second wiring pattern 22b) of the printed circuit board 3 to be exposed through the opening 29 is appropriately selected to form the opening 29 in the staircase shape. Another method of making the surface position of the second wiring pattern 22b and the surface positions of the semiconductor chips 1 and 2 equal with respect to the thick copper member 14 as the reference will be described. The first method is a method in which the thickness of the printed circuit board 3 is reduced and the inner wiring pattern (second wiring pattern 22b) of the printed circuit board 3 to be exposed through the opening 29 is appropriately selected so that the surface position of the second wiring pattern 22b and the surface positions of the semiconductor chips 1 and 2 are made equal with respect to the thick copper member 14 as the reference. For example, by selecting the dielectric constant or the like of the resin base material 23 of the printed circuit board 3, the thickness of the printed circuit board 3 can be changed. Further, the thickness of the first wiring patterns 22a and 22b may be changed. In the second method, the semiconductor chips 1 and 2 are thickened, and the inner wiring pattern (second wiring pattern 22b) of the printed circuit board 3 to be exposed through the opening 29 is appropriately selected to form the opening 29 in the staircase shape, and the surface position of the second wiring pattern 22b is made equal to the surface position of the semiconductor chips 1 and 2 with respect to the thick copper member 14 as the reference. The third method is a method in which the first method and the second method are used in combination to make the surface position of the second wiring pattern 22b and the surface positions of the semiconductor chips 1 and 2 with respect to the thick copper member 14 as the reference equal.

In the example in which the height of the inner second wiring pattern 22b exposed through the opening 29 formed in a staircase shape with respect to the thick copper member 14 as the reference is equal to the height of the semiconductor chips 1 and 2 with respect to the thick copper member 14 as the reference, the metal wires 12 connecting the second wiring pattern 22b of the printed circuit board 3 to the semiconductor chips 1 and 2 can be formed to be shortest in length. If the height of the inner second wiring pattern 22b exposed through the opening 29 formed in the staircase shape with respect to the thick copper member 14 as a reference is −10% to +10% of the height of the semiconductor chips 1 and 2 with respect to the thick copper member 14 as the reference, the second wiring pattern 22b and the semiconductor chips 1 and 2 can be connected with the metal wires 12 that are sufficiently short in length.

The high frequency circuit configured on the printed circuit board 3 includes the metal wires 12 that connects the semiconductor chip 1 in which the active element is formed, the semiconductor chip 2 in which the passive element is formed, and the wiring pattern. If the length of the metal wires 12 can be reduced, the configuration of the high frequency circuit formed after the step of connecting the metal wires 12 can be made flexible. In other words, the adjustment of the high frequency circuit can be facilitated. If the length of the metal wires 12 is longer than necessary, it is necessary to configure a circuit for canceling an excess length after the step of connecting the metal wires 12. This complicates the adjustment of the high frequency circuit and prolongs the adjustment work, thereby reducing the productivity.

In the semiconductor device 50 of Embodiment 4, the inner wiring pattern (second wiring pattern 22b) in the printed circuit board 3 having the multilayer structure is exposed through the opening 29 in the staircase shape, and the wire length of the metal wires 12 connecting the exposed second wiring pattern 22b and the semiconductor chips 1 and 2 is shortened, so that the flexibility in the configuration of the high frequency circuit, that is, the flexibility in designing the high frequency circuit can be increased. In addition, in the semiconductor device 50 of Embodiment 4, the wire length of the metal wires 12 is shortened, and thus it is possible to reduce the variation of the high frequency characteristics due to the variation in the wire length. Since the semiconductor device 50 of Embodiment 4 includes the structure of the semiconductor device 50 of Embodiment 1, the same effects as those of the semiconductor device 50 of Embodiment 1 can be obtained.

Embodiment 5

Figure 8:
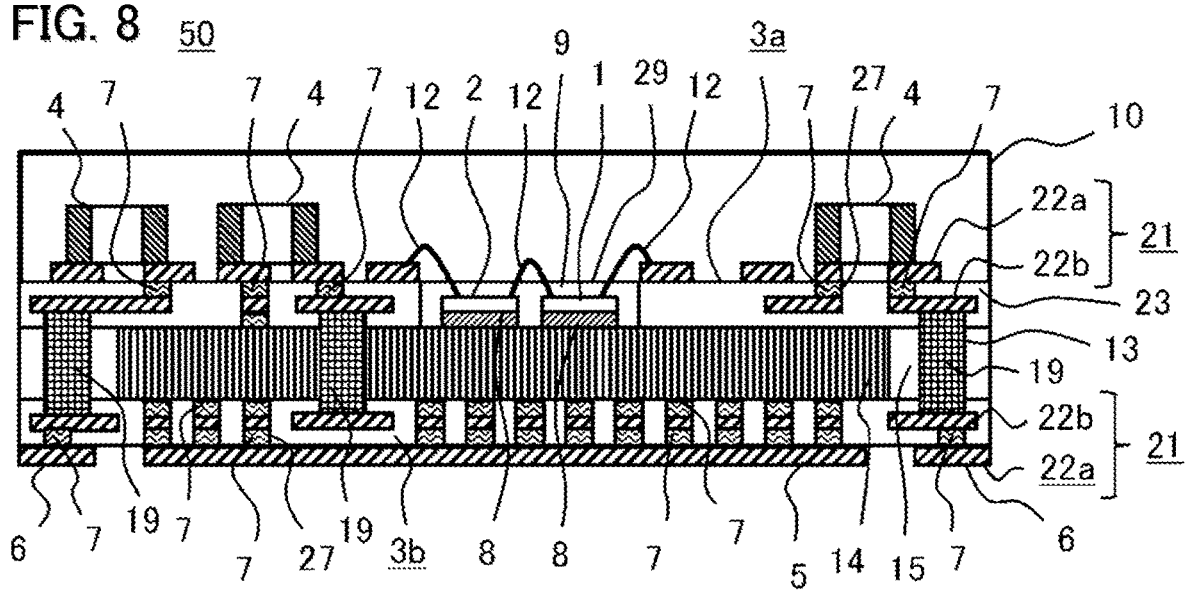
FIG. 8 is a schematic cross sectional view of a semiconductor device according to Embodiment 5.
Figure 9:
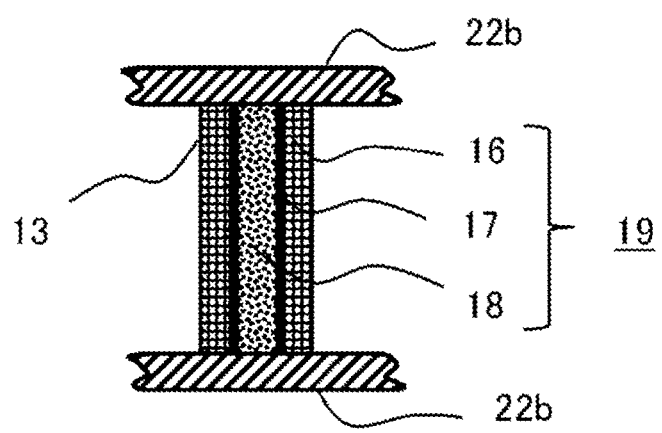
FIG. 9 is a diagram showing a first example of a connecting member of FIG. 8.
Figure 10:
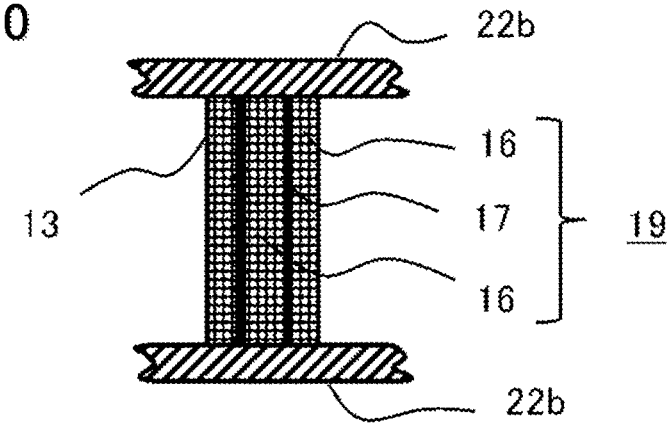
FIG. 10 is a diagram showing a second example of the connecting member of FIG. 8.
Figure 11:
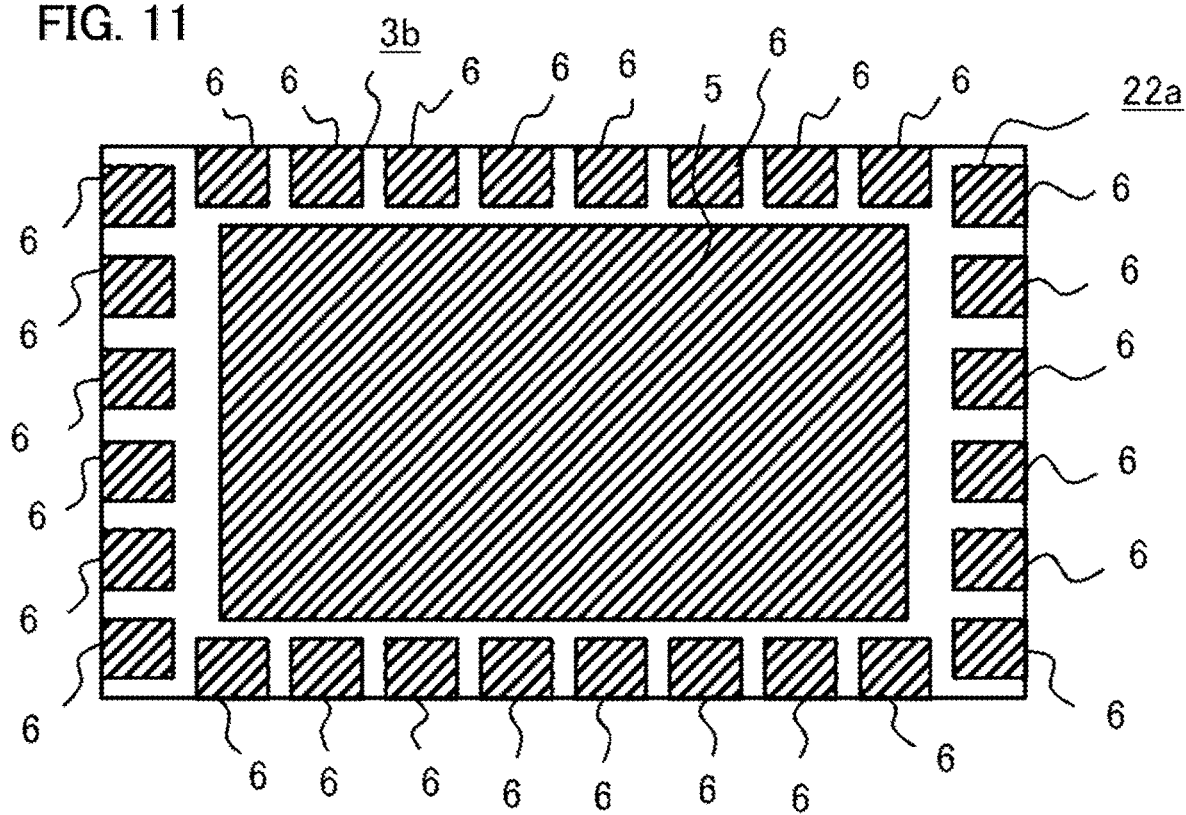
FIG. 11 is a diagram showing the rear surface of the semiconductor device of FIG. 8.

FIG. 8 is a schematic cross sectional view of a semiconductor device according to Embodiment 5. FIG. 9 is a diagram showing a first example of a connecting member of FIG. 8. FIG. 10 is a diagram showing a second example of the connecting member of FIG. 8. FIG. 11 is a diagram showing a rear surface of the semiconductor device of FIG. 8. The semiconductor device 50 of Embodiment 5 differs from the semiconductor device 50 of Embodiment 1 in that a first printed circuit board 3a (front-side printed circuit board) disposed on the front side (the mounting side of the semiconductor chips 1 and 2) of the thick copper member 14 and a second printed circuit board 3b (rear-side printed circuit board) on the rear side (the side opposite to the mounting side of the semiconductor chips 1 and 2) of the thick copper member 14 are provided. In the semiconductor device 50 of Embodiment 5, the second printed circuit board 3b is disposed on the rear surface of the thick copper member 14 in addition to the configuration shown in FIG. 1.

The semiconductor device 50 of Embodiment 5 includes the first printed circuit board 3a, the second printed circuit board 3b, the semiconductor chips 1 and 2, the electronic components 4, the thick copper member 14 formed on the rear surface of the first printed circuit board 3a, and the cap 10 for encapsulating the semiconductor chips 1 and 2, the electronic components 4, and the front surface of the first printed circuit board 3a (the surface opposite to the rear surface). The semiconductor chips 1 and 2 are directly mounted on the front surface (the surface facing the first printed circuit board 3a) of the thick copper member 14 exposed through the opening 29 of the first printed circuit board 3a with the die bonding material 8. The first printed circuit board 3a is the same as the printed circuit board 3 described in Embodiment 1. The second printed circuit board 3b is different from the first printed circuit board 3a in that the opening 29 is not formed. Since the opening 29 of the first printed circuit board 3a is formed in an opening forming step, the second printed circuit board 3b is the same in the configuration and the manufacturing method except for the opening 29. Unlike Embodiment 1, the thick copper member 14 of Embodiment 5 is disposed inside the semiconductor device 50 and is not exposed, so that the external electrode terminals 5 and 6 are not formed. The external electrode terminals 5 and 6 are formed in the wiring pattern (first wiring pattern 22a) on the exposed surface of the second printed circuit board 3b, not by the thick copper member 14.

FIG. 8 shows the printed circuit boards 3a and 3b each having two layers of the wiring pattern 21 (first wiring pattern 22a and second wiring pattern 22b). The wiring pattern on the exposed surface (the opposite side to the side facing the thick copper member 14) of the printed circuit board 3a is the first wiring pattern 22a, and the wiring pattern of the inner layer formed inside the printed circuit board 3 is the second wiring pattern 22b. The wiring pattern on the exposed surface (the opposite side to the side facing the thick copper member 14) of the printed circuit board 3b is the first wiring pattern 22a, and the wiring pattern of the inner layer formed inside the printed circuit board 3 is the second wiring pattern 22b. The first wiring pattern 22a and the second wiring pattern 22b are patterned by a plurality of wirings 25 to configure a part of the high frequency circuit mounted on the semiconductor device 50. The layers (first wiring pattern 22a and second wiring pattern 22b) of the printed circuit boards 3a and 3b are connected to each other by the vias 7 in which the via holes 27 are filled with copper, namely, the conductive vias 7. A part of the second wiring pattern 22b of inner layers in the printed circuit boards 3a, 3b is connected to the thick copper member 14 through the vias 7 in which via holes 27 are filled with copper in order to enhance heat dissipation of the printed circuit boards 3a, 3b. The high frequency circuits in the printed circuit board 3a and the printed circuit board 3b are connected to each other via a conductive connecting member 19 filled in a through hole 13 that is formed in a resin 15 disposed on the outer peripheral side of the thick copper member 14 or in the thick copper member 14.

The through hole 13 is usually filled with a resin (resin base material 23) of the printed circuit board 3 disposed on the front surface and the rear surface of the thick member. However, as shown in FIG. 8, when the thickness of the thick copper member 14 is larger than the thickness of the two printed circuit boards 3a and 3b, the through hole cannot be filled with the resin (resin base material 23) of the printed circuit boards 3a and 3b disposed on the front surface and the rear surface. In this case, filling the through hole 13 with the resin usually requires an additional step of filling the through hole 13 with a filling material before connecting the front and rear printed circuit boards 3a and 3b with the resin base material 23. The connecting member 19 as the filling material with which the through hole 13 is filled will be described referring to FIG. 9 and FIG. 10.

The connecting member 19 of the first shown in FIG. 9 includes an insulating resin 16 formed on the inner surface of the through hole 13, a metal 17 formed on the inner surface of the resin 16, and a conductive resin 18 formed on the inner surface of the metal 17. The connecting member 19 of the second shown in FIG. 10 includes the insulating resin 16 formed on the inner surface of the through hole 13, the metal 17 formed on the inner surface of the resin 16, and the insulating resin 16 formed on the inner surface of the metal 17. A method of forming the connecting member 19 of the first will be described. First, the inner surface of the through hole 13 is filled with the insulating resin 16, and a penetrated hole is formed therein. A layer of the metal 17 is formed on the inner surface of the penetrated hole by plating or the like, and the inner surface of the metal 17 is filled with the conductive resin 18. The method of forming the connecting member 19 of the second is similar to the method of forming the connecting member 19 of the first. However, the method of forming the connecting member 19 of the second is different from the method of forming the connecting member 19 of the first in that the inner surface of the metal 17 is filled with the insulating resin 16.

In the semiconductor device 50 of Embodiment 5, the external electrode terminals 5 and 6 are formed in the wiring pattern (first wiring pattern 22a) on the exposed surface of the second printed circuit board 3b, not by the thick copper member 14. The external electrode terminals 5 and 6 are formed by a wiring pattern (first wiring pattern 22a) that is patterned as shown in FIG. 11. The external electrode terminal 5 is an external electrode terminal connected to the thick copper member 14 on which the semiconductor chips 1 and 2 are mounted, and the external electrode terminals 6 are external electrode terminals disposed on the outer peripheral side of the external electrode terminal 5. FIG. 8 shows an example in which the external electrode terminal 5 is connected to the thick copper member 14 through the vias 7, the second wiring pattern 22b of the second printed circuit board 3b, and the vias 7. Further, an example is shown in which the external electrode terminals 6 are connected to the second wiring pattern 22b of the first printed circuit board 3a through the vias 7, the second wiring pattern 22b of the second printed circuit board 3b, and the connecting member 19 filled in the through hole 13. In the semiconductor device 50 of Embodiment 5, since the external electrode terminals 5 and 6 on the rear surface of the semiconductor device can be formed by the wiring pattern (first wiring pattern 22a) on the exposed surface of the printed circuit board 3b, the layout of the electrodes on the rear surface of the semiconductor device 50 can be designed in accordance with the constituent apparatus (mounting target apparatus) of the wireless communication system or the like on which the semiconductor device is to be installed. That is, in the semiconductor device 50 of Embodiment 5, the flexibility in designing the wiring pattern on the rear surface can be increased. Further, in the semiconductor device 50 of Embodiment 5, the semiconductor chips 1 and 2 are directly mounted with the die bonding material 8 on the front surface of the thick copper member 14 exposed through the opening 29 of the first printed circuit board 3a, and the thick copper member 14 is connected to the external electrode terminal 5 on the rear surface of the semiconductor device, and thus high heat dissipation characteristics are obtained. That is, in the semiconductor device 50 of Embodiment 5, even when a plurality of multilayer boards are provided, since the thick copper member 14 on which the semiconductor chips 1 and 2 are directly mounted is connected to the external electrode terminal 5 on the rear surface of the semiconductor device, it is possible to ensure high heat dissipation characteristics.

In the semiconductor device 50 of Embodiment 1, since the external electrode terminals 5 and 6 are formed of the thick copper member 14, the processing accuracy is limited in the etching process for forming the external electrode terminals 5 and 6 due to the thickness of the thick copper member 14. In this case, since the wiring pattern of the mounting target apparatus on which the semiconductor device 50 is to be mounted is also restricted by the processing accuracy of the external electrode terminals 5 and 6, a problem may arise in that the wiring pattern of the mounting target apparatus needs to be enlarged. In contrast, in the semiconductor device 50 of Embodiment 5, by adopting the structure described in Embodiment 5, the pattern of the external electrode terminals 5 and 6 on the rear surface of the semiconductor device can be designed to be laid out in accordance with the wiring pattern of the mounting target apparatus. Furthermore, in the semiconductor device 50 of Embodiment 5, since the external electrode terminal 5 (electrode terminal connected to the ground) on the rear surface of the semiconductor device are connected to the thick copper member 14 through the vias 7 in which the via holes 27 are filled with copper, and the second wiring pattern 22b of the second printed circuit board 3b, high heat dissipation characteristics can be achieved.

In the semiconductor device 50 of Embodiment 5, since the external electrode terminals 5 and 6 on the rear surface are formed by the second wiring pattern 22b of the printed circuit board 3b as compared with the case where the external electrode terminals 5 and 6 are formed of the thick copper member 14, the flexibility in the pattern layout of the external electrode terminals 5 and 6 on the rear surface increases, and the sizes and the positions of the external electrode terminals 5 and 6 can be designed in accordance with the layout of the wiring pattern of the mounting target apparatus. In the semiconductor device 50 of Embodiment 5, since the flexibility in designing the mounting target apparatus can be increased, an effective heat dissipation design in the mounting target apparatus can be carried out. Since the semiconductor device 50 of Embodiment 5 includes the thick copper member 14 as in the semiconductor device 50 of Embodiment 1, and the thick copper member 14 on which the semiconductor chips 1 and 2 are directly mounted is connected to the external electrode terminal 5 on the rear surface of the semiconductor device, the same effects as those of the semiconductor device 50 of Embodiment 1 are obtained.

As described above, the semiconductor device 50 of Embodiment 5 is a semiconductor device in which the plurality of external electrode terminals 5 and 6 to be connected to the mounting target apparatus to which the semiconductor device is to be installed are formed on the rear surface, and the semiconductor chip 1 for processing the high frequency signal is mounted. The semiconductor device 50 of Embodiment 5 includes the thick copper member 14 on which the semiconductor chip 1 is mounted, the printed circuit board 3a (front-side printed circuit board) disposed on the front surface of the thick copper member 14, and the rear-side printed circuit board that is another printed circuit board 3b disposed on the rear surface of the thick copper member 14. The printed circuit board 3a includes the opening 29 that exposes a part of the front surface of the thick copper member 14, the wiring pattern 21, and the conductive vias 7 that connect the wiring pattern 21 and the thick copper member 14. The another printed circuit board 3b (rear-side printed circuit board) is the printed circuit board including the another wiring pattern 21 and other conductive vias 7 connecting the another wiring pattern 21 to the thick copper member 14, and the another wiring pattern 21 formed so as to be exposed on the opposite side of the thick copper member 14 configures the plurality of external electrode terminals 5 and 6. The semiconductor device 50 of Embodiment 5 further includes the conductive connecting member 19 connecting the wiring pattern 21 to the another wiring pattern 21, semiconductor chip 1 mounted on the front surface of the thick copper member 14 exposed through the opening 29 and connected to the wiring pattern 21 by the metal wires 12, the electronic components 4 mounted on the front surface of the printed circuit board 3 opposite to the side facing the thick copper member 14 and connected to the wiring pattern 21, and the cap 10 or the epoxy resin 28 encapsulating or sealing the front surface of the printed circuit board 3 opposite to the side facing the thick copper member 14, the semiconductor chip 1, the electronic components 4, and the metal wires 12. In the semiconductor device 50 of Embodiment 5, with such a configuration, the semiconductor chip 1 is mounted on the front surface of the thick copper member 14 exposed through the opening 29 formed in the printed circuit board 3, and the rear surface of the thick copper member 14 is connected to the external electrode terminals 5 and 6 that are exposed, so that high heat dissipation characteristics can be maintained even when a complicated high frequency circuit is mounted.

Embodiment 6

Figure 12:
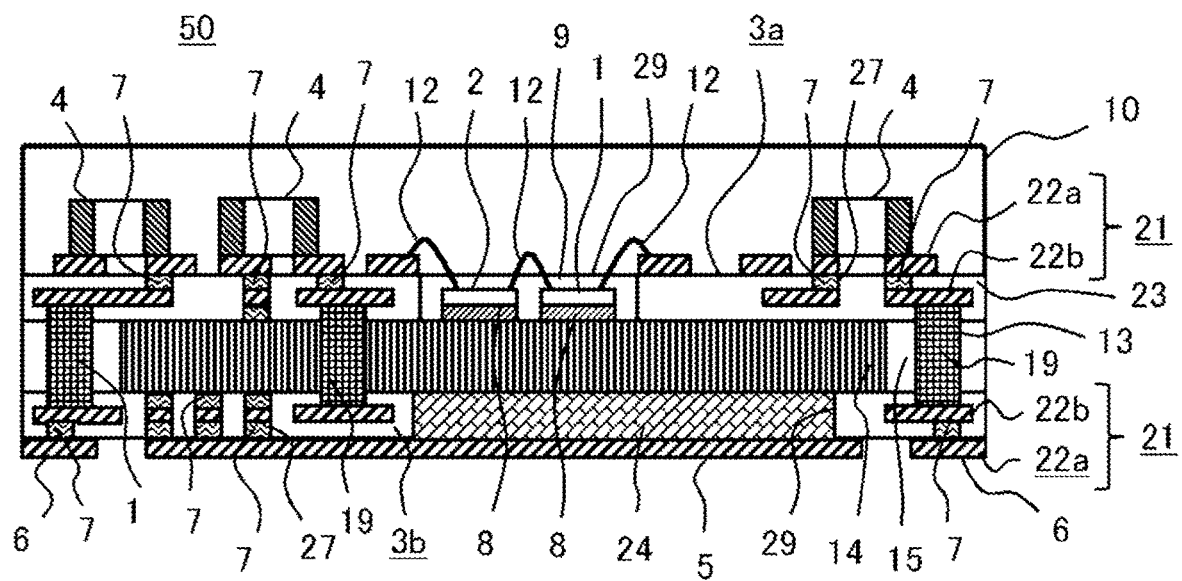
FIG. 12 is a schematic cross sectional view of a semiconductor device according to Embodiment 6.

FIG. 12 is a schematic cross sectional view of a semiconductor device according to Embodiment 6. The semiconductor device 50 of Embodiment 6 is different from the semiconductor device 50 of Embodiment 5 in that the second printed circuit board 3b is provided with the opening 29 that is formed so as to include a region directly below the semiconductor chip 1, and a copper layer 24 that fills the opening 29. The second printed circuit board 3b disposed on the rear side of the thick copper member 14 (on the side opposite to the mounting surface of the semiconductor chips 1 and 2) includes the opening 29 formed so as to include the region directly below the semiconductor chip 1 in which the active element is formed. That is, the opening 29 formed in the second printed circuit board 3b is formed so as to include a semiconductor chip symmetric region that is symmetric to the region in which the semiconductor chip 1 is mounted with respect to the thick copper member 14. The copper layer 24 is formed so as to fill the opening 29 formed in the second printed circuit board 3b. That is, the copper layer is disposed so as to cover the semiconductor chip symmetric region that is symmetric to the region in which the semiconductor chip 1 is mounted with respect to the thick copper member 14. FIG. 12 shows an example in which the opening 29 of the second printed circuit board 3b is formed in a wider region than the opening 29 formed in the first printed circuit board 3a. The opening 29 of the second printed circuit board 3b is formed in an opening forming step for the second printed circuit board 3b. In the opening forming step for the second printed circuit board 3b, the opening 29 reaching the thick copper member 14 is formed by laser or drilling before the first wiring pattern 22a on the outermost surface (exposed surface on the rear side) is formed. Then, the copper layer 24 is grown in the opening 29, for example, by plating so as to be flush with the resin base material 23 that is before the formation of the first wiring pattern 22a. The first wiring pattern 22a is formed on the exposed surfaces of the resin base material 23 and the copper layer 24 (external electrode terminal forming step). The external electrode terminals 5 and 6 are formed on the first wiring pattern 22a on the exposed surface of the second printed circuit board 3b.

FIG. 12 shows an example in which the external electrode terminal 5 is connected to the thick copper member 14 through two types of connection paths. As in Embodiment 5, the first connection path is the path through the vias 7 in which the via holes 27 are filled with copper, and the second wiring pattern 22b of the printed circuit board 3b. The second connection path is the path through the copper layer 24. In the semiconductor device 50 of Embodiment 6, the semiconductor chips 1 and 2 are directly mounted with the die bonding material 8 on the front surface of the thick copper member 14 exposed through the opening 29 of the first printed circuit board 3a, and the thick copper member 14 is connected to the external electrode terminal 5 on the rear surface of the semiconductor device through the two types of connection paths, so that high heat dissipation characteristics are obtained. That is, even when the semiconductor device 50 of Embodiment 6 includes a plurality of multilayer boards, since the thick copper member 14 on which the semiconductor chips 1 and 2 are directly mounted is connected to the external electrode terminal 5 on the rear surface of the semiconductor device, it is possible to ensure high heat dissipation characteristics.

In the semiconductor device 50 of Embodiment 5, since the external electrode terminal 5 that is not made of a thick copper is connected to the thick copper member 14 through the vias 7 filled with copper in the via holes 27 and the second wiring pattern 22b of the second printed circuit board 3b, the heat dissipation characteristics may be deteriorated when the heat generation of the semiconductor chip 1 in which the active element is formed is increased, as compared with the case where the external electrode terminal 5 is made of the thick copper member 14. In contrast, in the semiconductor device 50 of Embodiment 6, since the opening 29 is formed in the second printed circuit board 3b disposed on the rear side of the thick copper member 14 (the side opposite to the side facing the mounting surface of the semiconductor chips 1 and 2) so as to include the region directly below the semiconductor chip 1 where the active element is formed, and the thick copper member 14 and the external electrode terminal 5 are connected through the copper layer 24 filling the opening 29, it is possible to enhance heat dissipation compared to the semiconductor device 50 of Embodiment 5 and to ensure heat dissipation characteristics equivalent to that in the case where the external electrode terminal 5 is formed of the thick copper member 14.

In the semiconductor device 50 of Embodiment 6, the flexibility in the pattern layout of the external electrode terminals 5 and 6 on the rear surfaces is increased as in the semiconductor device 50 of Embodiment 5, and the sizes and positions of the external electrode terminals 5 and 6 can be designed in accordance with the layout of the wiring pattern of the mounting target apparatus, while the same level of heat dissipation characteristics as that in the case where the external electrode terminal 5 is formed of the thick copper member 14 is ensured. In the semiconductor device 50 of Embodiment 6, since the flexibility in designing the mounting target apparatus can be increased, an effective heat dissipation design in the mounting target apparatus can be carried out. The semiconductor device 50 of Embodiment 6 includes the thick copper member 14 as in the semiconductor device 50 of Embodiment 1, and the thick copper member 14 on which the semiconductor chips 1 and 2 are directly mounted is connected to the external electrode terminal 5 on the rear surface of the semiconductor device, and thus the same effects as those of the semiconductor device 50 of Embodiment 1 are obtained.

Figure 13:
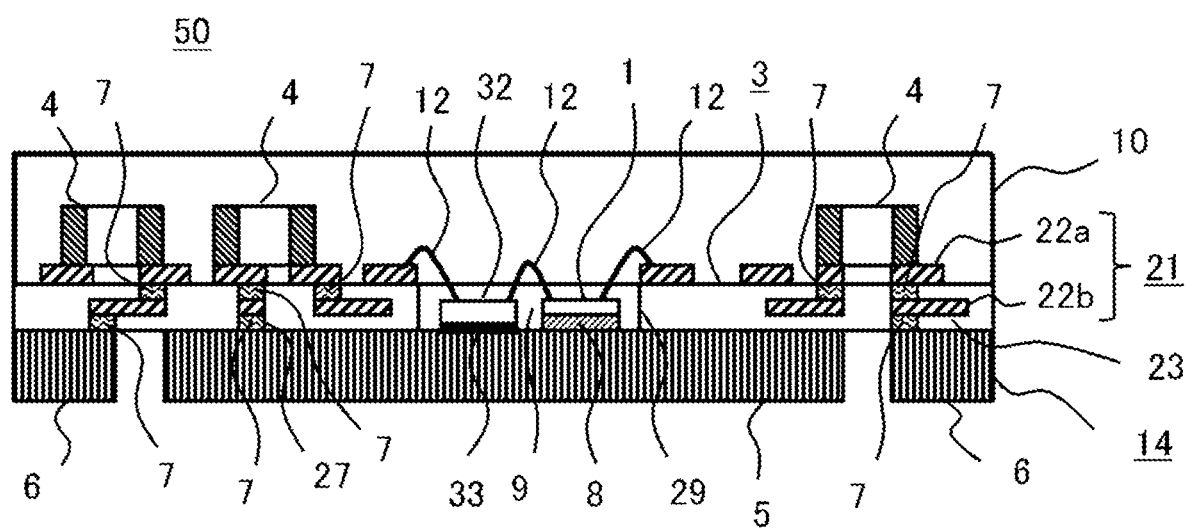
FIG. 13 is a schematic cross sectional view of the semiconductor device on which a semiconductor chip and a ceramic substrate are mounted.

In Embodiments 1 to 6, examples in which the passive element of a part of the high frequency circuit is formed in the semiconductor chip 2 are described, but as shown in FIG. 13, a ceramic substrate on which the passive element is formed may be mounted on the surface of the external electrode terminal 5 exposed through the opening 29. FIG. 13 is a schematic cross sectional view of the semiconductor device on which the semiconductor chip and the ceramic substrate are mounted. FIG. 13 shows an example in which the semiconductor chip 2 of FIG. 1 is replaced with the ceramic substrate 32. The ceramic substrate 32 is mounted on the surface of the external electrode terminal 5 exposed through the opening 29 with an adhesive 33.

A semiconductor chip that outputs power smaller than 1 W may be mounted on the semiconductor device 50 of Embodiments 1 to 6. Even if the semiconductor chip that outputs power smaller than 1 W is mounted and sealed with a resin, high heat dissipation characteristics can be maintained. Furthermore, although various exemplary embodiments and examples are described in the present application, various features, aspects, and functions described in one or more embodiments are not inherent in a particular embodiment, and can be applicable alone or in their various combinations to each embodiment. Accordingly, countless variations that are not illustrated are envisaged within the scope of the art disclosed herein. For example, the case where at least one component is modified, added or omitted, and the case where at least one component is extracted and combined with a component in another embodiment are included.

DESCRIPTION OF REFERENCE NUMERALS AND SIGNS

1: semiconductor chip, 2: semiconductor chip, 3: printed circuit board, 3a: printed circuit board, 3b: printed circuit board (rear-side printed circuit board), 4: electronic component, 5: external electrode terminal, 6: external electrode terminal, 7: via, 10: cap, 11: recess, 12: metal wire, 14: thick copper member, 16: resin, 17: metal (metal layer), 18: conductive resin, 19: connecting member, 21: wiring pattern, 22a: first wiring pattern, 22b: second wiring pattern, 24: copper layer, 28: epoxy resin, 29: opening, 32: ceramic substrate, 50: semiconductor device

The invention claimed is:

1. A semiconductor device including a plurality of external electrode terminals to be connected to a mounting target apparatus to which the semiconductor device is installed and formed on a rear surface of the semiconductor device, and a semiconductor chip for processing a high frequency signal, the semiconductor device comprising:
a thick copper member in which the plurality of the external electrode terminals are formed, the semiconductor chip being mounted on one of the plurality of the external electrode terminals;
a printed circuit board that is disposed on a front surface of the thick copper member and provided with:
an opening exposing a part of the front surface of the thick copper member,
a wiring pattern, and
a conductive via connecting the wiring pattern and the thick copper member,
the semiconductor chip being mounted on the front surface of the thick copper member exposed through the opening and connected to the wiring pattern by a metal wire;
an electronic component that is mounted on a front surface of the printed circuit board opposite to a side facing the thick copper member and connected to the wiring pattern;
another semiconductor chip in which a passive element is formed or a ceramic substrate in which the passive element is formed, the another semiconductor chip or the ceramic substrate being mounted on the front surface of the thick copper member exposed through the opening and connected to the wiring pattern and the semiconductor chip by other metal wires; and
a cap or an epoxy resin that encapsulates or seals:
the front surface of the printed circuit board opposite to the side facing the thick copper member,
the semiconductor chip,
the electronic component,
the metal wire, and
the another semiconductor chip or the ceramic substrate, wherein
the semiconductor chip includes an active element.

2. The semiconductor device according to claim 1, wherein the printed circuit board includes a recess on a side surface of the opening.

3. A semiconductor device including a plurality of external electrode terminals to be connected to a mounting target apparatus to which the semiconductor device is to be installed and formed on a rear surface of the semiconductor device, and a semiconductor chip for processing a high frequency signal, the semiconductor device comprising:
a thick copper member on which the semiconductor chip is mounted;
a printed circuit board that is disposed on a front surface of the thick copper member and provided with:
an opening exposing a part of the front surface of the thick copper member,
a wiring pattern, and
a conductive via that connects the wiring pattern and the thick copper member;
a rear-side printed circuit board being another printed circuit board that is disposed on a rear surface of the thick copper member and provided with:
another wiring pattern,
another via that is conductive and connects the another wiring pattern, and
the thick copper member, wherein the another wiring pattern is exposed to a side opposite to another side facing the thick copper member and includes the plurality of the external electrode terminals;
a conductive connecting member that connects the wiring pattern to the another wiring pattern, the semiconductor chip being mounted on the front surface of the thick copper member exposed through the opening and being connected to the wiring pattern by a metal wire;
an electronic component that is mounted on a front surface of the printed circuit board opposite to a side facing the thick copper member and connected to the wiring pattern; and
a cap or an epoxy resin that encapsulates or seals the front surface of the printed circuit board opposite to the side facing the thick copper member, the semiconductor chip, the electronic component, and the metal wire.

4. The semiconductor device according to claim 3, wherein the rear- side printed circuit board includes a copper layer for connecting the plurality of the external electrode terminals formed on a surface opposite to the another side facing the thick copper member, to the rear surface of the thick copper member, and the copper layer is disposed so as to cover a semiconductor chip symmetric region that is a symmetric region to a region in which the semiconductor chip is mounted with respect to the thick copper member.

5. The semiconductor device according to claim 4, wherein the connecting member includes an insulating resin formed on an outer peripheral side of the thick copper member, a metal layer formed on an inner side of the insulating resin, and a conductive resin formed on an inner side of the metal layer.

6. The semiconductor device according to claim 4, wherein the connecting member includes an insulating resin formed on an outer peripheral side of the thick copper member, a metal layer formed on an inner side of the insulating resin, and another insulating resin formed on an inner side of the metal layer.

7. The semiconductor device according to claim 4, wherein the printed circuit board includes a recess on a side surface of the opening.

8. The semiconductor device according to claim 3, wherein a height of the wiring pattern formed on the front surface of the printed circuit board opposite to the side facing the thick copper member with respect to the thick copper member as a reference is −10% to +10% of a height of the semiconductor chip with respect to the thick copper member as the reference.

9. The semiconductor device according to claim 4, wherein a height of the wiring pattern formed on the front surface of the printed circuit board opposite to the side facing the thick copper member with respect to the thick copper member as a reference is −10% to +10% of a height of the semiconductor chip with respect to the thick copper member as the reference.

10. The semiconductor device according to claim 4, wherein the printed circuit board is a multilayer printed circuit board, the opening of the printed circuit board is formed in a stair case shape to expose a part of the wiring pattern formed inside, and a height of the wiring pattern exposed through the opening with respect to the thick copper member as the reference is −10% to +10% of a height of the semiconductor chip with respect to the thick copper member as the reference.

11. The semiconductor device according to claim 3, wherein the connecting member includes an insulating resin formed on an outer peripheral side of the thick copper member, a metal layer formed on an inner side of the insulating resin, and a conductive resin formed on an inner side of the metal layer.

12. The semiconductor device according to claim 11, wherein the printed circuit board includes a recess on a side surface of the opening.

13. The semiconductor device according to claim 3, wherein the connecting member includes an insulating resin formed on an outer peripheral side of the thick copper member, a metal layer formed on an inner side of the insulating resin, and another insulating resin formed on an inner side of the metal layer.

14. The semiconductor device according to claim 13, wherein the printed circuit board includes a recess on a side surface of the opening.

15. The semiconductor device according to claim 3, wherein the printed circuit board includes a recess on a side surface of the opening.

16. The semiconductor device according to claim 3, wherein the printed circuit board is a multilayer printed circuit board, the opening of the printed circuit board is formed in a stair case shape to expose a part of the wiring pattern formed inside, and a height of the wiring pattern exposed through the opening with respect to the thick copper member as the reference is −10% to +10% of a height of the semiconductor chip with respect to the thick copper member as the reference.

17. The semiconductor device according to claim 3, wherein the semiconductor chip includes an active element, and wherein the semiconductor device is further provided with another semiconductor chip or a ceramic substrate in which a passive element is formed, the another semiconductor chip or the ceramic substrate being mounted on the front surface of the thick copper member exposed through the opening and connected to the wiring pattern and the semiconductor chip by other metal wires, and the another semiconductor chip or the ceramic substrate being encapsulated or sealed by the cap or the epoxy resin.

18. A semiconductor device including a plurality of external electrode terminals to be connected to a mounting target apparatus to which the semiconductor device is installed and formed on a rear surface of the semiconductor device, and a semiconductor chip for processing a high frequency signal, the semiconductor device comprising:
a thick copper member in which the plurality of the external electrode terminals are formed, the semiconductor chip being mounted on one of the plurality of the external electrode terminals;
a printed circuit board that is disposed on a front surface of the thick copper member and provided with:
an opening exposing a part of the front surface of the thick copper member,
a wiring pattern, and
a conductive via connecting the wiring pattern and the thick copper member, the semiconductor chip being mounted on the front surface of the thick copper member exposed through the opening and connected to the wiring pattern by a metal wire;
an electronic component that is mounted on a front surface of the printed circuit board opposite to a side facing the thick copper member and connected to the wiring pattern; and
a cap or an epoxy resin that encapsulates or seals:
the front surface of the printed circuit board opposite to the side facing the thick copper member,
the semiconductor chip,
the electronic component, and
the metal wire,
wherein a height of the wiring pattern formed on the front surface of the printed circuit board opposite to the side facing the thick copper member with respect to the thick copper member as a reference is −10% to +10% of a height of the semiconductor chip with respect to the thick copper member as the reference.

19. A semiconductor device including a plurality of external electrode terminals to be connected to a mounting target apparatus to which the semiconductor device is installed and formed on a rear surface of the semiconductor device, and a semiconductor chip for processing a high frequency signal, the semiconductor device comprising:
a thick copper member in which the plurality of the external electrode terminals are formed, the semiconductor chip being mounted on one of the plurality of the external electrode terminals;
a printed circuit board that is disposed on a front surface of the thick copper member and provided with:
an opening exposing a part of the front surface of the thick copper member,
a wiring pattern, and
a conductive via connecting the wiring pattern and the thick copper member, the semiconductor chip being mounted on the front surface of the thick copper member exposed through the opening and connected to the wiring pattern by a metal wire;
an electronic component that is mounted on a front surface of the printed circuit board opposite to a side facing the thick copper member and connected to the wiring pattern; and
a cap or an epoxy resin that encapsulates or seals:
the front surface of the printed circuit board opposite to the side facing the thick copper member,
the semiconductor chip,
the electronic component, and
the metal wire, wherein the printed circuit board is a multilayer printed circuit board, the opening of the printed circuit board is formed in a stair case shape to expose a part of the wiring pattern formed inside, and a height of the wiring pattern exposed through the opening with respect to the thick copper member as the reference is −10% to +10% of a height of the semiconductor chip with respect to the thick copper member as the reference.

\* \* \* \* \*